United States Patent [19]
Partyka

[11] Patent Number: 5,566,183
[45] Date of Patent: Oct. 15, 1996

[54] SYSTEM AND METHOD FOR DEINTERLEAVING DIGITAL DATA

[75] Inventor: Andrzej F. Partyka, Bedminster, N.J.

[73] Assignee: Lucent Technologies Inc., Murray Hill, N.J.

[21] Appl. No.: 348,424

[22] Filed: Dec. 2, 1994

[51] Int. Cl.$^6$ .................................................. G06F 11/00
[52] U.S. Cl. ............................ 371/2.1; 379/89; 375/340
[58] Field of Search ........................... 371/2.1, 2.2, 39.1, 371/38.1, 40.1; 375/340; 379/89, 84

[56] References Cited

U.S. PATENT DOCUMENTS

| | | | |
|---|---|---|---|
| 4,425,644 | 1/1984 | Scholz | 371/40 |
| 5,022,029 | 6/1991 | Guichon | 371/38.1 |
| 5,351,244 | 9/1994 | Rialan et al. | 371/2.1 |
| 5,430,767 | 7/1995 | Min | 375/340 |

*Primary Examiner*—Robert W. Beausoliel, Jr.
*Assistant Examiner*—Phung My Chung

[57] ABSTRACT

A deinterleaver for reordering elements of an interleaved digital data sequence (data packet) to obtain an original digital data sequence. The deinterleaver is used in a mobile station operating in a mobile communication system. The interleaved digital data sequence is previously generated by interleaving elements of an original digital data sequence such that digital data elements located in successive positions of the original digital data sequence are located in positions separated by one or more intervening digital data elements in the interleaved digital data sequence. The deinterleaver comprises a data buffer for storing the interleaved digital data sequence; a decoder to generate a first address of a desired data element of the interleaved digital data sequence, the first address corresponding to a position of the desired data element in the original digital data sequence; and an address twister to translate the first address to a second address corresponding to a position of the desired data element in the interleaved digital data sequence; wherein the data buffer is accessed according to the second address to retrieve the desired data element of the original digital data sequence.

8 Claims, 5 Drawing Sheets

SYSTEM AND METHOD FOR DEINTERLEAVING DIGITAL DATA

BACKGROUND OF THE INVENTION

1. Field of the Invention

The present invention relates generally to cellular communication systems, and more particularly to deinterleaver circuits for use in cellular communication systems.

2. Related Art

North American Standard IS95 is a cellular telephone communication standard. Standard IS95 specifies the use of Code Division Multiple Access (CDMA), which is a form of modulation in which digital information is encoded and interleaved in an expanded bandwidth format (i.e., spread spectrum).

In a cellular communication environment, signal strength varies with location and movement of the mobile stations. Such variation in signal strength can result in high error rates, which can significantly adversely affect the quality of communication. Standard IS95 provides an error correction scheme based on convolutional encoding/decoding and interleaving/deinterleaving to minimize such signal interference and errors.

In a cellular communication system, a base station transmits a stream of data packets to a mobile station (i.e., a cellular telephone) as follows. The base station receives a digital data packet (a sequence of digitized audio data, for example) from a data source, such as a telephone network. The base station encodes and interleaves the data packet.

The interleaving process operates to reorder the data elements in the data packet. For example, assume that the data elements in a 5-element data packet are originally ordered as follows: D1, D2, D3, D4, D5. After interleaving, the data elements in the data packet may be reordered as follows: D2, D4, D1, D5, D3 (note that this particular reordering sequence is used only for illustrative purposes).

The base station transmits (i.e., broadcasts) the encoded and interleaved data packet to the mobile station. The mobile station deinterleaves and decodes the digital data to thereby obtain the original data packet.

The deinterleaving process operates to reorder the data elements in the interleaved data packet such that these data elements are ordered as they were in the original data packet. In the above example, the data elements in the interleaved data packet were ordered as follows: D2, D4, D1, D5, D3. After deinterleaving, the data elements in the deinterleaved data packet are reordered as follows: D1, D2, D3, D4, D5.

The deinterleaved and decoded data packet is then processed in a well known manner. For example, the data packet may be transferred to audio components of the mobile station.

The interleaving process (in conjunction with convolutional encoding) operates to lower burst error rates. A burst error is a grouping of errors that occur in a relatively short period of time, as opposed to errors that occur over a long time period. Burst errors are errors that affect consecutive bits in a transmitted data packet, as opposed to random errors that occur over the whole data stream.

The interleaving process spreads (in time) the effects of any potential burst errors. Specifically, the interleaved data packet transmitted from the base station to the mobile station may be subject to burst errors. However, such errors are spread in time after deinterleaving by the mobile station. By lowering the burst error rate, the ability for error correction using convolutional coding is enhanced.

FIG. 3 is a block diagram of a conventional mobile station 360. An antenna 314 receives the data packet transmitted by the base station, and stores this data packet in an input buffer 310, which forms part of a deinterleaver 354. A deinterleaving module 320 accesses the input buffer 310 and retrieves the data packet's data elements according to a deinterleaving sequence which is complementary to the interleaving sequence (i.e., the order in which the data elements were ordered during the interleaving process in the base station). These data elements are stored in an output buffer 330 in the order in which they were retrieved from the input buffer 310. A convolutional decoder 356 retrieves the deinterleaved data elements from the output buffer 330, and then decodes these data elements to obtain the original data packet. The decoded data packet is then transferred to audio components 358 (for example) for processing.

The interleaving and deinterleaving processes shall now be considered in greater detail by referring to the above example, where the data elements in the data packet were originally ordered as follows: D1, D2, D3, D4, D5, and the data elements in the interleaved data packet (that is, after interleaving in the base station) were reordered as follows: D2, D4, D1, D5, D3. Thus, the interleaving sequence specifies that the data element in position 1 of the original data packet is stored in position 3 of the interleaved data packet. The data element in position 2 of the original data packet is stored in position 1 of the interleaved data packet. The complete interleaving sequence is as shown in Table 1:

TABLE 1

| Interleaving Sequence | |
|---|---|
| Original Position | Interleaved Position |
| 1 | 2 |
| 2 | 4 |
| 3 | 1 |
| 4 | 5 |
| 5 | 3 |

In this example, the deinterleaving sequence specifies that the data element in position 2 of the interleaved data packet is stored in position 1 of the deinterleaved data packet (that is, memory location 1 of the output buffer 330). The data element in position 4 of the interleaved data packet is stored in position 2 of the deinterleaved data packet (that is, memory location 2 of the output buffer 330). The complete deinterleaving sequence is as shown in Table 2:

TABLE 2

| Deinterleaving Sequence | |
|---|---|
| Interleaved Position | Deinterleaved Position |
| 2 | 1 |
| 4 | 2 |
| 1 | 3 |
| 5 | 4 |
| 3 | 5 |

Conventionally, the deinterleaving module 320 deinterleaves the data packet stored in the input buffer 310 using complex computation techniques. Such complex computation techniques involve a mathematical formula which may be implemented using a specialized circuitry or software implementation. Such circuitry is large in area and consumes great amounts of electrical current. Accordingly, deinterleaving using complex computation techniques places a burden on system resources, which are particularly limited in mobile stations.

Alternatively, the deinterleaving module 320 conventionally deinterleaves the data packet stored in the input buffer 310 using a look-up table, such as Table 2 shown above. The look-up table is implemented using specialized circuitry. Such circuitry is typically large in area. Accordingly, deinterleaving using a look-up table also places a burden on system resources.

SUMMARY OF THE INVENTION

The present invention overcomes the above described drawbacks. The present invention is directed to system and method for deinterleaving digital data. The present invention does not use complex computation techniques or a look-up table requiring large circuitry area and/or high current consumption to perform this deinterleaving function. The system provides for a deinterleaver which reorders elements of an interleaved digital data sequence to obtain an original digital data sequence. The deinterleaver comprises a data buffer for storing the interleaved digital data sequence; a decoder to generate a first address of a desired data element of the interleaved digital data sequence, the first address corresponding to a position of the desired data element in the original digital data sequence; an address twister to translate the first address to a second address corresponding to a position of the desired data element in the interleaved digital data sequence; and means for accessing the data buffer according to the second address to retrieve the desired data element of the original digital data sequence. This method of deinterleaving digital data is simple to implement and requires minimal circuitry area and current consumption.

Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE DRAWINGS

The present invention will be described with reference to the accompanying drawings, wherein.

DETAILED DESCRIPTION OF THE PREFERRED EMBODIMENTS

Figure 1:
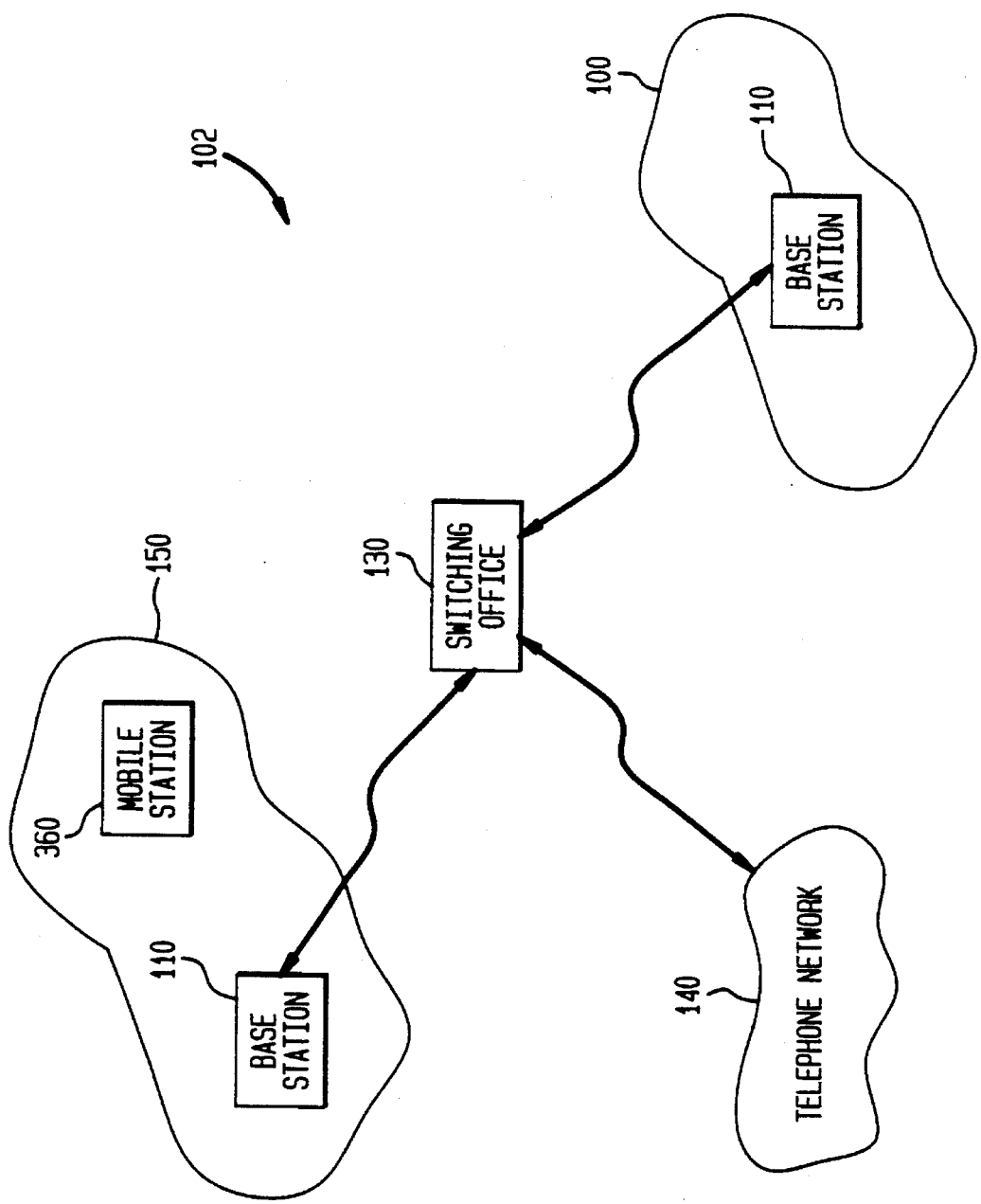
FIG. 1 is a block diagram of a cellular communication system.

FIG. 1 is a block diagram of a cellular communication system 102 which includes a telephone network 140, a switching office 130, a plurality of cells 150, a plurality of base stations (cell sites) 110, and a plurality of mobile stations (wireless telephones, such as cellular telephones) 360. The telephone network 140 sends digital data packets (in streams of digitized audio data) to the switching office 130. The switching office 130 then routes the digital data packets to the base stations 110. Finally, the digital data packets are transmitted (broadcasted) from the base stations 110 to the mobile stations 360.

Communication from the mobile stations 360 to the telephone network 140 is done in a similar but reversed manner. Thus, the encoders, decoders, interleavers, and deinterleavers in the base stations 110 and the mobile stations 360 perform similar functions. Their respective circuitries, however, are different due to the different requirements, functionalities, and limitations between the base and mobile stations. These limitations include, for example, size and power requirements of the mobile stations 360. The present invention is directed to new deinterleavers and methods of deinterleaving to minimize IC (integrated chip) area and power consumption in the mobile stations 360.

Figure 2:
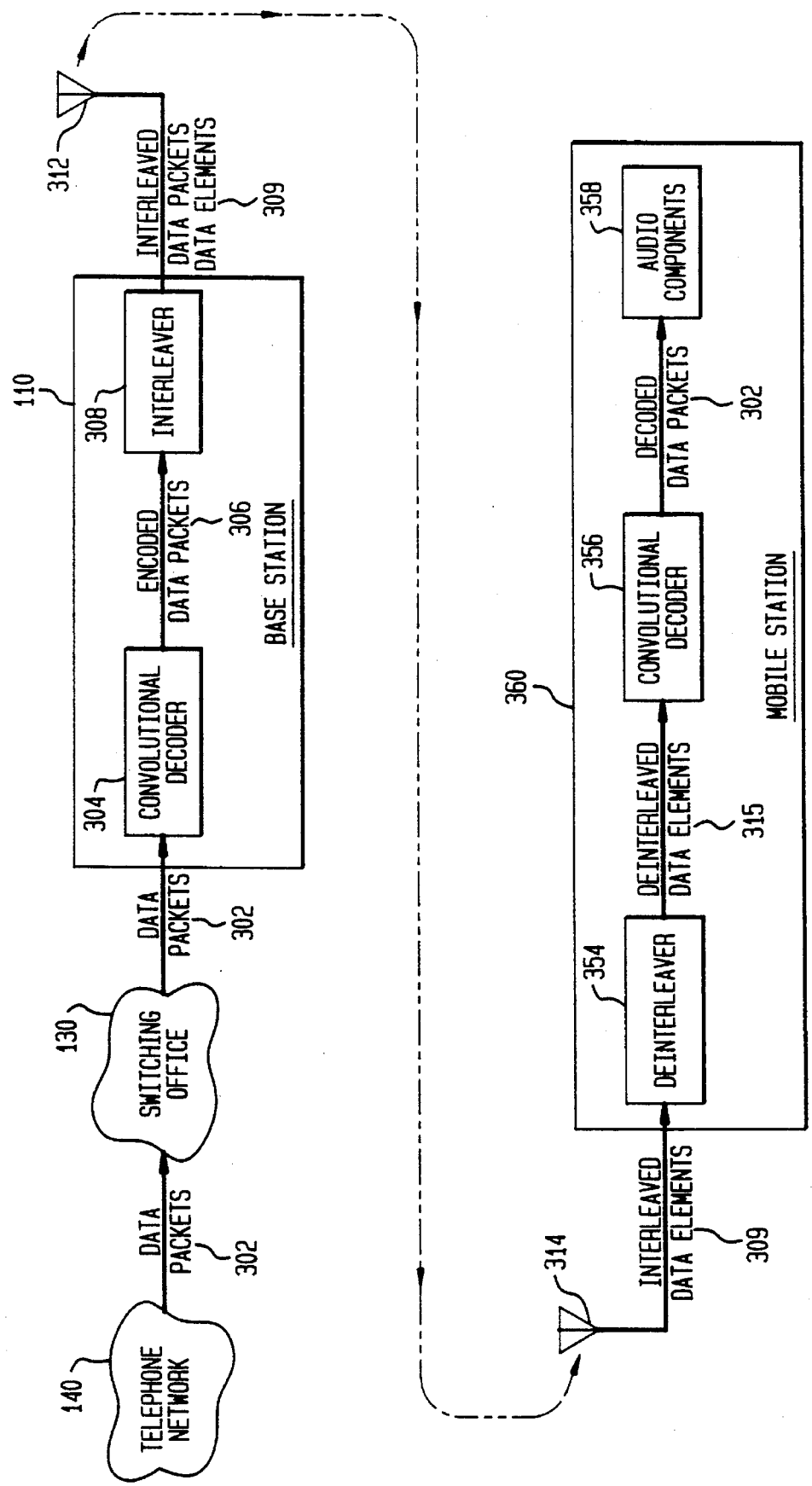
FIG. 2 is a block diagram of a base station and a mobile station.
Figure 3:
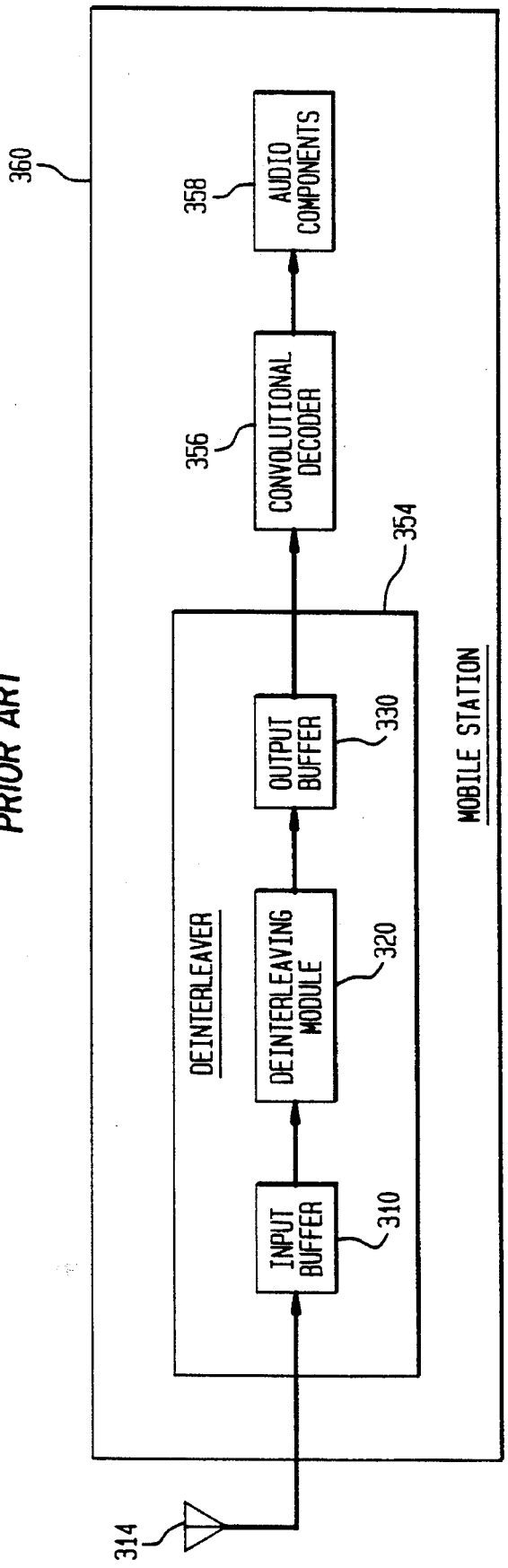
FIG. 3 is a block diagram of a mobile station having a conventional deinterleaver.

Referring to FIG. 2, the base station 110 includes a convolutional encoder 304 and an interleaver 308. The mobile station 360 includes a deinterleaver 354, a convolution decoder 356, and audio components 358. The base and mobile stations communicate with each other as follows. The base station 110 receives data packets 302 from a telephone network 140 via a switching office 130. The data packets 302 are then encoded in the convolutional encoder 304 in a well known manner according to Standard IS95 to provide for error-correction. The encoded data packets 306 are then interleaved in the interleaver 308. This is done by reordering data elements of the encoded data packets 306. The interleaving process (in conjunction with convolutional encoding) operates to lower burst error rates. The base station 110 then broadcasts the interleaved data packet's data elements 309 to the mobile station 360 via transmitter 312.

The mobile station 360 receives the interleaved data elements 309 via receiver 314. The interleaved data elements 309 are deinterleaved by the deinterleaver 354 (such deinterleaving is discussed below). The deinterleaved data elements 315 are next sent to the convolutional decoder 356 for decoding. The convolutional decoder 356 decodes the deinterleaved data elements 315 to obtain the original data packets 302. The data packets 302 are then processed in a well known manner by audio components 358.

Figure 4:
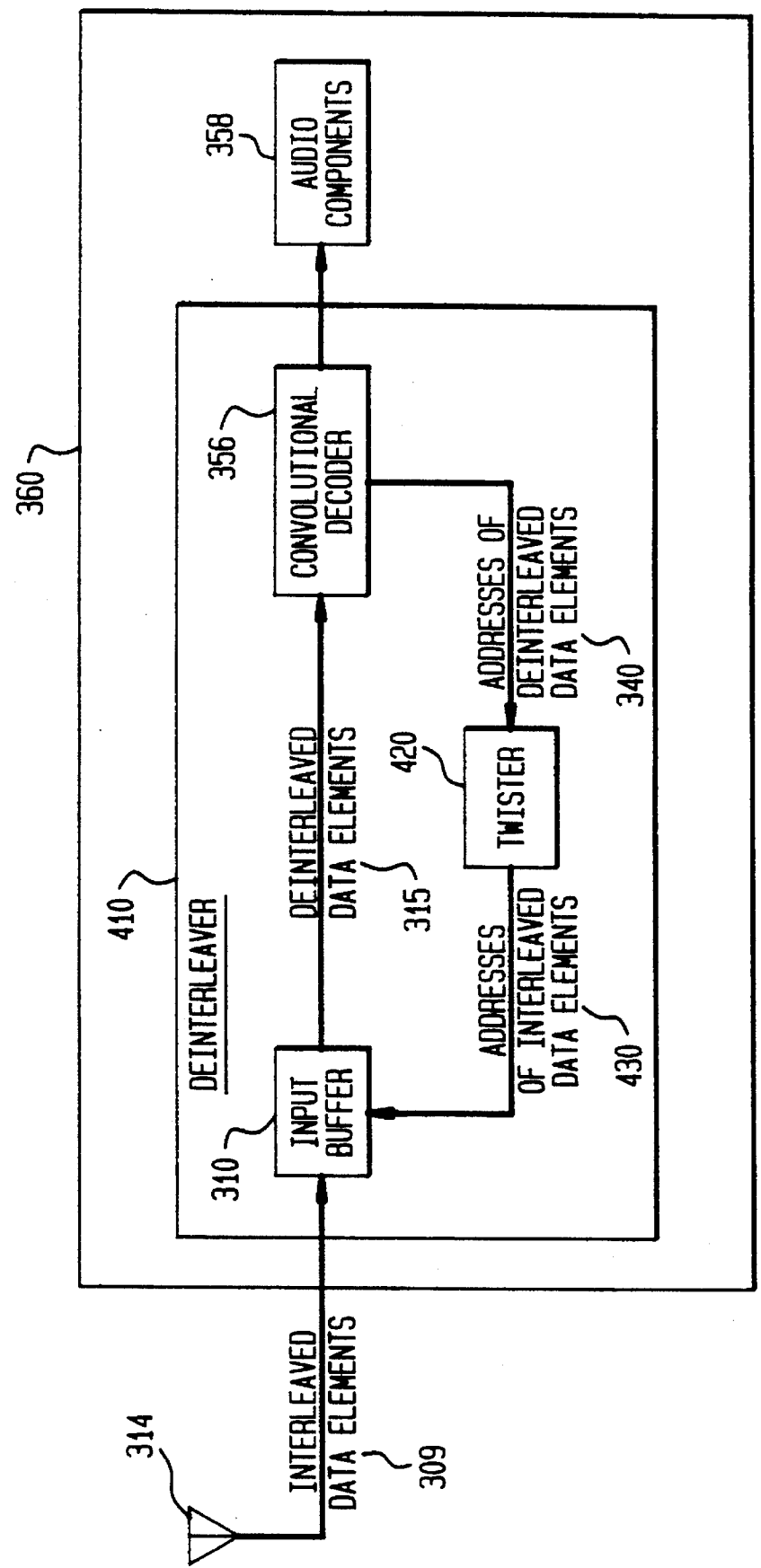
FIG. 4 is a block diagram of a deinterleaver according to a preferred embodiment of the present invention.

FIG. 4 is a block diagram of the mobile station 360 which includes a deinterleaver 410 according to a preferred embodiment of the present invention. Note that the convolutional decoder 356 is shown as being part of the deinterleaver 410, but it may alternatively be distinct from the deinterleaver 410. In FIG. 4, the interleaved data packet's data elements 309 from the base station 110 are received by the receiver 314. The interleaved data elements 309 are stored in an input buffer 310 of the deinterleaver 410. The interleaved data elements 309 stay in the input buffer 310 until retrieved by the convolutional decoder 356. The convolutional decoder 356 retrieves data from the input buffer 310 by generating addresses 340 that address such data. However, in the present invention, the convolutional decoder 356 is not aware of the interleaving operation performed by the interleaver in the base station 110. Consequently, the convolutional decoder 356 does not know that the data elements are stored in the input buffer 310 in an interleaved sequence. Accordingly, the addresses 340 generated by the decoder 356 correspond to the positions of the data elements 309 before they were interleaved by the interleaver in the base station 110. For example, the addresses 340 generated by the decoder are as follows: 1, 2, 3, 4, etc.

The present invention provides an address twister 420 which translates the addresses 340 generated by the decoder 356 into actual addresses 430 of the interleaved data elements 309 as these data elements are stored in the input buffer 310. This simplifies the design and operation of the deinterleaver. For example, suppose that the data elements in the data packet were originally ordered as follows: D1, D2, D3, D4, D5. Also suppose that the interleaver in the base station 110 interleaved these data elements according to the interleaving sequence shown in Table 1. According to the present invention, the address twister 420 translates the addresses 340 generated by the decoder 356 in accordance with that shown in Table 2. Thus, if the decoder 356 sends the address "1" to the twister 420, the twister 420 translates this address to "2". Similarly, if the decoder 356 sends addresses "2", "3", "4", and "5" to the twister 420, the twister 420 would translate these addresses to "4", "1", "5", and "3", respectively.

The sequence shown in Table 1 is provided by way of example only. Preferably, the interleaver 308 in the base station 110 and the deinterleaver 410 in the mobile station 360 operate according to the interleaving and deinterleaving sequences specified by IS95.

Tables 501 and 502 illustrate the deinterleaving sequence according to IS95. In Tables 501 and 502, the positions of the data elements are shown from 1–384. However, the actual positions of the data elements are normally 0–383. Therefore, to obtain the correct locations of the data elements in the input buffer 310 according to Tables 501 and 502, a "1" must be subtracted from the values shown. For example, the deinterleaving sequence according to Tables 501 and 502 specifies that position "1", shown as "2" as indicated by reference number 510 (2−1=1; see Table 502), of the interleaved data packet is stored in position "192", shown as "193" as indicated by reference number 520 (193−1=192; see Table 501), of the deinterleaved data packet (that is, memory location "192" of the input buffer 310). The data element in position "2", shown as "3" as indicated by reference number 530 (3−1=2), of the interleaved data packet is stored in position "96", shown as "97" as indicated by reference number 540 (97−1=96), of the deinterleaved data packet (that is, memory location "96" of the input buffer 310). The complete deinterleaving sequence is as shown in Tables 501 and 502 below.

TABLE 501

DEINTERLEAVED POSITIONS

| 1 | 25 | 49 | 73 | 540 | 121 | 145 | 169 | 520 | 217 | 241 | 265 | 560 | 313 | 337 | 361 |
|---|----|----|----|-----|-----|-----|-----|-----|-----|-----|-----|-----|-----|-----|-----|
| 2 | 26 | 50 | 74 | 98 | 122 | 146 | 170 | 194 | 218 | 242 | 266 | 290 | 314 | 338 | 362 |
| 3 | 27 | 51 | 75 | 99 | 123 | 147 | 171 | 195 | 219 | 243 | 267 | 291 | 315 | 339 | 363 |
| 4 | 28 | 52 | 76 | 100 | 124 | 148 | 172 | 196 | 220 | 244 | 268 | 292 | 316 | 340 | 364 |
| 5 | 29 | 53 | 77 | 101 | 595 | 149 | 173 | 197 | 221 | 245 | 269 | 293 | 317 | 341 | 365 |
| 6 | 30 | 54 | 78 | 102 | 126 | 150 | 174 | 198 | 222 | 246 | 270 | 294 | 318 | 342 | 366 |
| 580 | 31 | 55 | 79 | 103 | 127 | 151 | 175 | 199 | 223 | 247 | 271 | 295 | 319 | 343 | 367 |
| 8 | 32 | 56 | 80 | 104 | 128 | 152 | 176 | 200 | 224 | 248 | 272 | 296 | 320 | 344 | 368 |
| 9 | 33 | 57 | 81 | 105 | 129 | 153 | 177 | 201 | 225 | 249 | 273 | 297 | 321 | 345 | 369 |
| 10 | 34 | 58 | 82 | 106 | 130 | 154 | 178 | 202 | 226 | 250 | 274 | 298 | 322 | 346 | 370 |
| 11 | 35 | 59 | 83 | 107 | 131 | 155 | 179 | 203 | 227 | 251 | 275 | 299 | 323 | 347 | 371 |
| 12 | 36 | 60 | 84 | 108 | 132 | 156 | 180 | 204 | 228 | 252 | 276 | 300 | 324 | 348 | 372 |
| 13 | 37 | 61 | 85 | 109 | 133 | 157 | 181 | 205 | 229 | 253 | 277 | 301 | 325 | 349 | 373 |
| 14 | 38 | 62 | 86 | 110 | 134 | 158 | 182 | 206 | 230 | 254 | 278 | 302 | 326 | 350 | 374 |
| 15 | 39 | 63 | 87 | 111 | 135 | 159 | 183 | 207 | 231 | 255 | 279 | 303 | 327 | 351 | 375 |
| 16 | 40 | 64 | 88 | 112 | 136 | 160 | 184 | 208 | 232 | 256 | 280 | 304 | 328 | 352 | 376 |
| 17 | 41 | 65 | 89 | 113 | 137 | 161 | 185 | 209 | 233 | 257 | 281 | 305 | 329 | 353 | 377 |
| 18 | 42 | 66 | 90 | 114 | 138 | 162 | 186 | 210 | 234 | 258 | 282 | 306 | 330 | 354 | 378 |
| 19 | 43 | 67 | 91 | 115 | 139 | 163 | 187 | 211 | 235 | 259 | 283 | 307 | 331 | 355 | 379 |
| 20 | 44 | 68 | 92 | 116 | 140 | 164 | 188 | 212 | 236 | 260 | 284 | 308 | 332 | 356 | 380 |
| 21 | 45 | 69 | 93 | 117 | 141 | 165 | 189 | 213 | 237 | 261 | 285 | 309 | 333 | 357 | 381 |
| 22 | 46 | 70 | 94 | 118 | 142 | 166 | 190 | 214 | 238 | 262 | 286 | 310 | 334 | 358 | 382 |
| 23 | 47 | 71 | 95 | 119 | 143 | 167 | 191 | 215 | 239 | 263 | 287 | 311 | 335 | 359 | 383 |
| 24 | 48 | 72 | 96 | 120 | 144 | 168 | 192 | 216 | 240 | 264 | 288 | 312 | 336 | 360 | 384 |

TABLE 502

DEINTERLEAVED POSITIONS

| 1 | 9 | 5 | 13 | 530 | 11 | 7 | 15 | 510 | 10 | 6 | 14 | 550 | 12 | 8 | 16 |
|---|---|---|----|-----|----|---|----|-----|----|---|----|-----|----|---|----|
| 65 | 73 | 69 | 77 | 67 | 75 | 71 | 79 | 66 | 74 | 70 | 78 | 68 | 76 | 72 | 80 |
| 129 | 137 | 133 | 141 | 131 | 139 | 135 | 143 | 130 | 138 | 134 | 142 | 132 | 140 | 136 | 144 |
| 193 | 201 | 197 | 205 | 195 | 203 | 199 | 207 | 194 | 202 | 198 | 206 | 196 | 204 | 200 | 208 |
| 257 | 265 | 261 | 269 | 259 | 590 | 263 | 271 | 258 | 266 | 262 | 270 | 260 | 268 | 264 | 272 |
| 321 | 329 | 325 | 333 | 323 | 331 | 327 | 335 | 322 | 330 | 326 | 334 | 324 | 332 | 328 | 336 |
| 570 | 41 | 37 | 45 | 35 | 43 | 39 | 47 | 34 | 42 | 38 | 46 | 36 | 44 | 40 | 48 |
| 97 | 105 | 101 | 109 | 99 | 107 | 103 | 111 | 98 | 106 | 102 | 110 | 100 | 108 | 104 | 112 |
| 161 | 169 | 165 | 173 | 163 | 171 | 167 | 175 | 162 | 170 | 166 | 174 | 164 | 172 | 168 | 176 |
| 225 | 233 | 229 | 237 | 227 | 235 | 231 | 239 | 226 | 234 | 230 | 238 | 228 | 236 | 232 | 240 |
| 289 | 297 | 293 | 301 | 291 | 299 | 295 | 303 | 290 | 298 | 294 | 302 | 292 | 300 | 296 | 304 |
| 353 | 361 | 357 | 365 | 355 | 363 | 359 | 367 | 354 | 362 | 358 | 366 | 356 | 364 | 360 | 368 |
| 17 | 25 | 21 | 29 | 19 | 27 | 23 | 31 | 18 | 26 | 22 | 30 | 20 | 24 | 24 | 32 |
| 81 | 89 | 85 | 93 | 83 | 91 | 87 | 95 | 82 | 90 | 86 | 94 | 84 | 88 | 88 | 96 |
| 145 | 153 | 149 | 157 | 147 | 155 | 151 | 159 | 146 | 154 | 150 | 158 | 148 | 152 | 152 | 160 |

TABLE 502-continued

| DEINTERLEAVED POSITIONS | | | | | | | | | | | | | | | |
|---|---|---|---|---|---|---|---|---|---|---|---|---|---|---|---|
| 209 | 217 | 213 | 221 | 211 | 219 | 215 | 223 | 210 | 218 | 214 | 222 | 212 | 216 | 216 | 224 |
| 273 | 281 | 277 | 285 | 275 | 283 | 279 | 287 | 274 | 282 | 278 | 286 | 276 | 280 | 280 | 288 |
| 337 | 345 | 341 | 349 | 339 | 347 | 343 | 351 | 338 | 346 | 342 | 350 | 340 | 344 | 344 | 352 |
| 49 | 57 | 53 | 61 | 51 | 59 | 55 | 63 | 50 | 58 | 54 | 62 | 52 | 56 | 56 | 64 |
| 113 | 121 | 117 | 125 | 115 | 123 | 119 | 127 | 114 | 122 | 118 | 126 | 116 | 120 | 120 | 128 |
| 177 | 185 | 181 | 189 | 179 | 187 | 183 | 191 | 178 | 186 | 182 | 190 | 180 | 184 | 184 | 192 |
| 241 | 249 | 245 | 253 | 243 | 251 | 247 | 255 | 242 | 250 | 246 | 254 | 244 | 248 | 248 | 256 |
| 305 | 313 | 309 | 317 | 307 | 315 | 311 | 319 | 306 | 314 | 310 | 318 | 308 | 312 | 312 | 320 |
| 369 | 377 | 373 | 381 | 371 | 779 | 375 | 383 | 370 | 378 | 374 | 382 | 372 | 376 | 376 | 384 |

The manner in which the address twister 420 translates the address 340 so as to deinterleave in accordance with IS95 shall now be described. The preferred implementation of the twister 420 is based on the following observation made by the inventor: if each address 340 generated by the decoder 356 is expressed as a nine bit binary value $b_8$–$b_0$ ($b_0$ is the LSB), then in order to generate the correct address for this data element as stored in the input buffer 310, it is necessary to assign different weighting values of the bits $b_8$ through $b_0$ (i.e., non-binary weighting values) as shown in Table 3. The weightings shown in Table 3 are specific to IS95. It should be understood that the present invention is adapted and intended to operate according to other interleaving/deinterleaving standards and/or definitions. The weightings for such other standards/definitions will be apparent to persons skilled in the relevant art based on the discussion contained herein.

TABLE 3

Address Twister Decomposition

| bit | binary weighing | address twister weighing | decomposition |
|---|---|---|---|
| $b_0$ | 1 | 192 | 128 + 64 |
| $b_1$ | 2 | 96 | 64 + 32 |
| $b_2$ | 4 | 48 | 32 + 16 |
| $b_3$ | 8 | 24 | 16 + 8 |
| $b_4$ | 16 | 12 | 8 + 4 |
| $b_5$ | 32 | 6 | 4 + 2 |
| $b_6$ | 64 | 1 | 1 |
| $b_7$ | 128 | 2 | 2 |
| $b_8$ | 256 | 4 | 4 |

For example, if data element "3" (with respect to the positioning of data elements in the original, non-interleaved data packet) is needed, the decoder 356 will generate address "3" ($b_0$=1, $b_1$=1, $b_2$–$b_8$=0). The address twister 420 assigns a weight of "192" to bit $b_0$, instead of "1", and assigns a weight of "96" to bit $b_1$, instead of "2". Thus, a new address is produced: 192+96="288". This is indeed the position at which data element "3" is stored in the input buffer 310 in accordance with IS95. This can be verified by the deinterleaving sequence of Tables 501 and 502, where the address "3" is shown as "4", as indicated by reference number 550 (4−1=3), and the new address "288" is shown as "289", as indicated by reference number 560 (288+1=289).

Implementation of the address twister 420 is also based on the inventor's observation that the required weightings can be decomposed as shown in the column called "decomposition" in Table 3. This is further described below.

Figure 5:
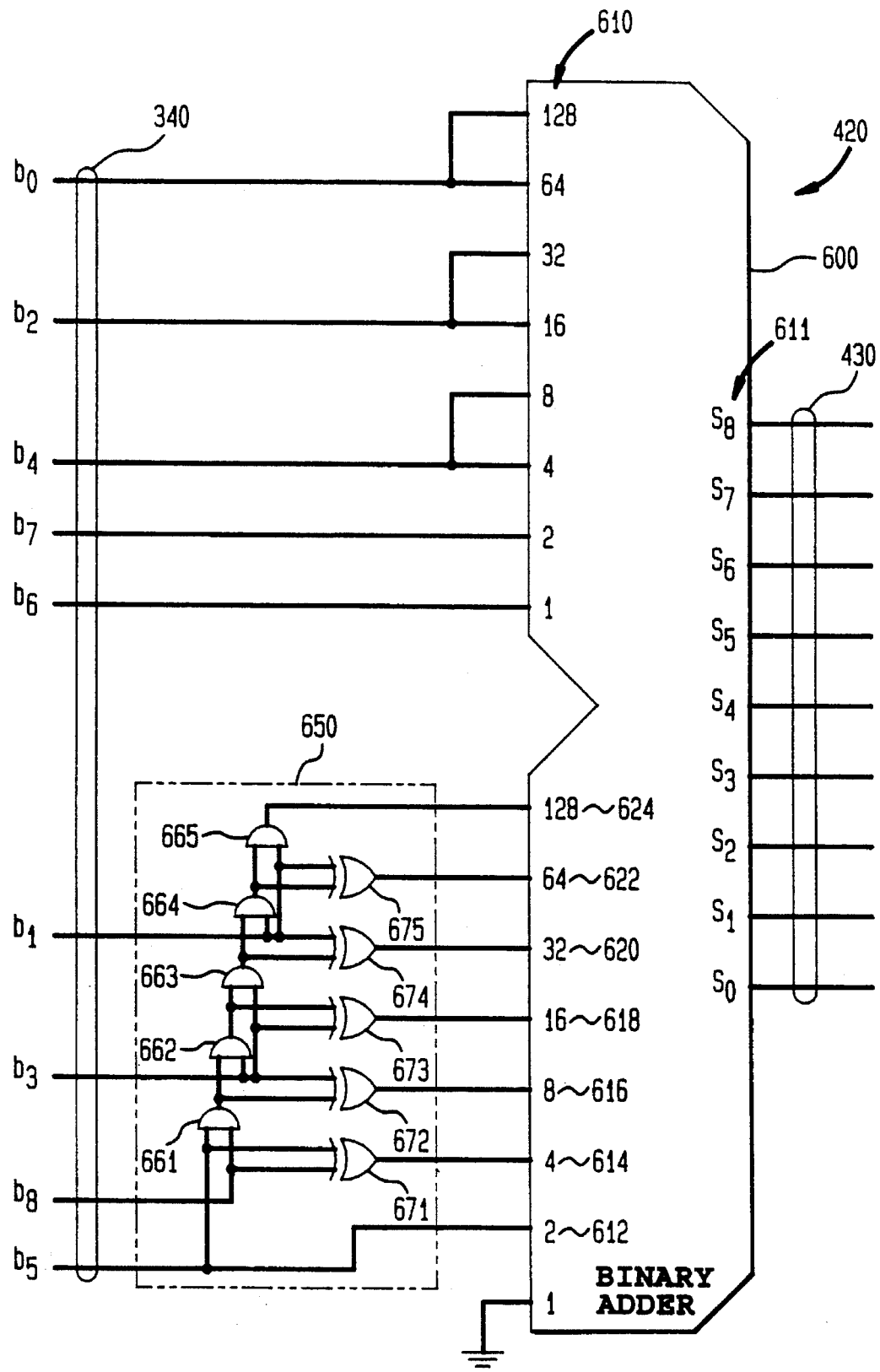
FIG. 5 illustrates an address twister according to a preferred embodiment of the present invention.

FIG. 5 illustrates an address twister 420 of a preferred embodiment of the present invention. The twister 420 comprises a well known 8-bit binary adder 600 (which operates to add two 8-bit binary numbers) and a circuit 650 for adding an extra weighted value of "4". The twister 420, by assigning different weightings to addresses 340 (having bits $b_0$–$b_8$), generates addresses 430 to retrieve the desired deinterleaved data elements 315 from the input buffer 310.

The 8-bit binary adder 600 provides for 16 inputs 610 and 9 outputs 611. The 16 inputs 610 correspond to 2 weighted inputs each of 1, 2, 4, 8, 16, 32, 64, and 128. The 9 outputs 611 carry the address 430 generated by the twister 420 for retrieving the deinterleaved data elements 315 from the input buffer 310. The address lines $b_8$–$b_0$ 340 from the convolutional decoder 356 are assigned to the inputs of the binary adder 600 as shown in FIG. 5. For example, address line $b_0$ is assigned to one of the weighted input of 128 and one of the weighted input of 64. Thus, if data element "1" is needed, the decoder 356 will generate address "1" ($b_0$=1 and all others are 0). Since $b_0$ is assigned to each of the weighted inputs of 128 and 64, the twister 420 will generate an address of 128+64="192", which is the location of the desired deinterleaved data element corresponding to the address "1" from the decoder 356 (see items 510 and 520 in Tables 501 and 502, respectively; recall that it is necessary to subtract "1" from items 510 and 520).

According to the "decomposition" of Table 3, however, an additional weight of "4" is needed to accommodate all the weighting values of the twister 420. Specifically, address lines $b_4$, $b_5$, and $b_8$ each requires a weighted input of 4. Since the binary adder 600 provides for only 2 weighted inputs of 4, the circuit 650 is provided to realize the third weighted input of 4. The way that circuit 650 provides an additional weight of "4" is described below.

The assignments of the weighted inputs 610 of the binary adder 600 to the bits of the address 340 shall now be described in greater detail. A first weight of 1 is assigned to address line $b_6$ and a second weight of 1 is grounded. A first weight of 2 is assigned to address line $b_7$ and a second weight of 2, in combination with a first weight of 4, is assigned to address line $b_5$ through the circuit 650. A second weight of 4, in combination with a first weight of 8, is assigned to address line $b_4$. A third weight of 4 is assigned to address line $b_8$ through the circuit 650. A second weight of 8, in combination with a first weight of 16, is assigned to address line $b_3$ through the circuit 650. A second weight of 16, in combination with a first weight of 32, is assigned to address line $b_2$. A second weight of 32, in combination with a first weight of 64, is assigned to address line $b_1$ through the circuit 650. A second weight of 64, in combination with a first weight of 128, is assigned to address line $b_0$. Finally, a second weight of 128 is assigned to address lines $b_1$, $b_3$, $b_8$, and $b_5$ through the circuit 650.

The circuit 650 includes five AND gates (661, 662, 663, 664, and 665) and five Exclusive-OR gates (671, 672, 673, 674, and 675) that are connected as shown in FIG. 5 to generate an additional weight of "4". For those skilled in the art of digital logic design, it will be apparent that the circuit 650 comprises five cascaded one bit adders (AND gates 661, 662, 663, 664, and 665) with each carry bit fed to the next stage and the sum bits fed to the 8-bit binary adder 600 with the exception of the last carry which is fed to the 8-bit binary adder's weighted input 128, as indicated by reference number 624. It will also be apparent that through circuit 650, $b_1$ acts on the weighted inputs 64 and 32 (as indicated by reference numbers 622 and 620, respectively), $b_3$ on weighted inputs 16 and 8 (as indicated by reference numbers 618 and 616, respectively), $b_8$ on weighted input 4 (as indicated by reference number 614), and $b_5$ on weighted inputs 4 and 2 (as indicated by reference numbers 614 and 612, respectively). For example, if data element "32" is needed, the decoder 356 will generate address "32" ($b_5$=1 and all others ($b_0$–$b_4$, $b_6$–$b_8$) are 0). The address twister 420 takes bit $b_5$ with weight "2" (input 612). According to the circuit 650, since $b_5$=1 and $b_8$=0, these two address bits are exclusive-ORed in gate 671 to generate an additional weighted output of "4" (input 614). This weighted output of "4" is added with the weighted output of "2" and, thus, a new address is produced: 4+2="6". This is the position at which the data element corresponding to address "32" is stored in the input buffer 310. This can be verified by the deinterleaving sequence of Tables 501 and 502, where the address "32" is shown as "33", as indicated by reference number 570 (33–1=32), and the new address "6" is shown as "7", as indicated by reference number 580 (7–1=6). Note that the circuit 650 is connected in such a manner that since $b_1$ and $b_3$ are both "0" in the above example, they do not generate any additional weighted outputs for the new address.

In another example, if data element "266" is needed, the decoder 356 will generate address "266" ($b_1$, $b_3$, and $b_8$=1 and $b_0$, $b_2$, $b_4$, $b_5$, $b_6$, and $b_7$ =0). Since $b_5$=0, it does not generate any additional weighted inputs for the new address. Next, $b_5$ ("0") and $b_8$ ("1") are exclusive-ORed in gate 671 to generate a weighted output of "4" (input 614). $b_5$ and $b_8$ are then ANDed 661 to give an output of "0"; this output is exclusive-ORed in gate 672 with $b_3$ ("1") to generate a weighted output of "8" (input 616). The output of the AND gate 661 ("0") and $b_3$ ("1") are next ANDed in gate 662 to give an output of "0"; this output is exclusive-ORed in gate 673 with $b_3$ to generate a weighted output of "16" (input 618). The output of the AND gate 662 ("0") and $b_3$ ("1") are ANDed in gate 663 to give an output of "0"; this output is exclusive-ORed in gate 674 with $b_1$ ("1") to generate a weighted output of "32" (input 620). Next, the output of the AND gate 663 ("0") and $b_1$ ("1") are ANDed in gate 664 to give an output of "0"; this output is exclusive-ORed in gate 675 with $b_1$ ("1") to generate a weighted output of "64" (input 622). Finally, the output of the AND gate 664 ("0") and $b_1$ ("1") are ANDed in gate 665 to give an output of "0". Thus, a new address is produced by summing up all the weighted outputs: 4+8+16+32+64="124". This is the position at which the data element corresponding to address "266" is stored in the input buffer 310. This can be verified by the deinterleaving sequence of Tables 501 and 502, where the address "266" is shown as "267", as indicated by reference number 590 (267–1=266), and the new address "124" is shown as "125", as indicated by reference number 595 (125–1=124). Therefore, the binary adder 600 and the circuit 650 are used to realize the address twister 420 based on the required weightings as shown in the "decomposition" of Table 3.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A deinterleaver for reordering elements of an interleaved digital data sequence, for use in a mobile station operating in a mobile communication system, said interleaved digital data sequence having been previously generated by interleaving elements of an original digital data sequence such that digital data elements located in successive positions of said original digital data sequence are located in positions separated by one or more intervening digital data elements in said interleaved digital data sequence, said deinterleaver comprising:

a data buffer for storing the interleaved digital data sequence;

a decoder, connected to said data buffer, for generating a first address of a desired data element of said interleaved digital data sequence, said first address corresponding to a position of said desired data element in said original digital data sequence;

an address twister, connected to said data buffer and said decoder, for translating said first address to a second address corresponding to a position of said desired data element in said interleaved digital data sequence; and means for accessing said data buffer according to said second address to retrieve said desired data element.

2. The deinterleaver of claim 1, wherein said address twister assigns non-binary weights to bits of said first address to obtain said second address.

3. The deinterleaver of claim 2, wherein said address twister further comprises:

means for assigning a weight of 192 to bit position 0 of said first address;

means for assigning a weight of 96 to bit position 1 of said first address;

means for assigning a weight of 48 to bit position 2 of said first address;

means for assigning a weight of 24 to bit position 3 of said first address;

means for assigning a weight of 12 to bit position 4 of said first address;

means for assigning a weight of 6 to bit position 5 of said first address;

means for assigning a weight of 1 to bit position 6 of said first address;

means for assigning a weight of 2 to bit position 7 of said first address; and means for assigning a weight of 4 to bit position 8 of said first address.

4. A method for reordering elements of an interleaved digital data sequence, for use in a mobile station operating in a mobile communication system, said interleaved digital data sequence having been previously generated by interleaving elements of an original digital data sequence such that digital data elements located in successive positions of said original digital data sequence are located in positions separated by one or more intervening digital data elements in said interleaved digital data sequence, said method comprising the steps of:

(1) providing for a data storage device for storing the interleaved digital data sequence;

(2) generating a first address of a desired data element of said interleaved digital data sequence, said first address corresponding to a position of said desired data element in said original digital data sequence;

(3) translating said first address to a second address corresponding to a position of said desired data element in said interleaved digital data sequence; and (4) accessing said data storage device according to said second address to retrieve said desired data element.

5. The method according to claim 4, wherein the step of translating said first address to said second address is done by assigning non-binary weights to bits of said first address to obtain said second address.

6. The method according to claim 5, wherein the step of translating said first address to said second address further comprises the steps of:

(5) assigning a weight of 192 to bit position 0 of said first address;

(6) assigning a weight of 96 to bit position 1 of said first address;

(7) assigning a weight of 48 to bit position 2 of said first address;

(8) assigning a weight of 24 to bit position 3 of said first address;

(9) assigning a weight of 12 to bit position 4 of said first address;

(10) assigning a weight of 6 to bit position 5 of said first address;

(11) assigning a weight of 1 to bit position 6 of said first address;

(12) assigning a weight of 2 to bit position 7 of said first address; and

(13) assigning a weight of 4 to bit position 8 of said first address.

7. The method according to claim 4, wherein different weighting schemes of said translating step are used for deinterleaving different interleaving schemes.

8. An apparatus for reordering elements of an interleaved digital data sequence, for use in a mobile station operating in a mobile communication system, said interleaved digital data sequence having been previously generated by interleaving elements of an original digital data sequence such that digital data elements located in successive positions of said original digital data sequence are located in positions separated by one or more intervening digital data elements in said interleaved digital data sequence, said apparatus comprises:

(a) a data buffer for storing the interleaved digital data sequence;

(b) a plurality of data lines for retrieving a desired data element of said interleaved digital data sequence, each of which is connected to said data buffer;

(c) a decoder for generating a first address of said desired data element of said interleaved digital data sequence, said first address corresponding to a position of said desired data element in said original digital data sequence, said decoder is connected to said plurality of data lines;

(d) a plurality of first address lines for fetching said desired data element in said original digital data sequence, each of which is connected to said decoder;

(e) an address twister for translating said first address to a second address corresponding to a position of said desired data element in said interleaved digital data sequence, said address twister being connected to said plurality of said first address lines; and (f) a plurality of second address lines for fetching said desired data element in said data buffer according to said second address, each of which is connected to said twister and said data buffer.

* * * * *